U S008916394B2

United States Patent
Toda et al.

(10) Patent No.: US 8,916,394 B2
(45) Date of Patent: Dec. 23, 2014

(54) METHOD FOR MANUFACTURING A CARBON NANOTUBE FIELD EMISSION DEVICE WITH OVERHANGING GATE

(71) Applicant: California Institute of Technology, Pasadena, CA (US)

(72) Inventors: Risaku Toda, Pasadena, CA (US); Michael J. Bronikowski, Altadena, CA (US); Edward M. Luong, Pasadena, CA (US); Harish Manohara, Arcadia, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/919,842

(22) Filed: Jun. 17, 2013

(65) Prior Publication Data

US 2013/0280830 A1 Oct. 24, 2013

Related U.S. Application Data

(63) Continuation of application No. 12/140,564, filed on Jun. 17, 2008, now abandoned.

(60) Provisional application No. 61/008,034, filed on Dec. 18, 2007, provisional application No. 60/936,049, filed on Jun. 18, 2007.

(51) Int. Cl.
| | | |
|---|---|---|
| *H01L 21/302* | (2006.01) | |
| *H01J 3/02* | (2006.01) | |
| *H01J 1/304* | (2006.01) | |
| *B82Y 10/00* | (2011.01) | |
| *B82Y 20/00* | (2011.01) | |
| *H01J 9/02* | (2006.01) | |
| *B82Y 40/00* | (2011.01) | |

(52) U.S. Cl.
CPC ............. *H01L 21/302* (2013.01); *H01J 3/022* (2013.01); *H01J 1/3042* (2013.01); *B82Y 10/00* (2013.01); *B82Y 20/00* (2013.01); *H01J 1/3044* (2013.01); *H01J 3/021* (2013.01); *H01J 9/025* (2013.01); *H01J 2203/0224* (2013.01); *B82Y 40/00* (2013.01); *Y10S 977/842* (2013.01); *Y10S 977/939* (2013.01)
USPC ................ 438/20; 438/34; 977/939; 977/842

(58) Field of Classification Search
CPC ......... H01J 1/3042; H01J 3/022; H01J 9/025; H01L 21/302; Y10S 977/939
USPC ...................................................... 438/20, 34
See application file for complete search history.

(56) References Cited

U.S. PATENT DOCUMENTS 5,430,347 A * 7/1995 Kane et al. ..................... 313/309
6,062,931 A * 5/2000 Chuang et al. .................. 445/24

(Continued)

OTHER PUBLICATIONS

Final Office Action mailed on Nov. 23, 2011 issued for U.S. Appl. No. 12/140,564, filed Jun. 17, 2008 in the name of Risaku Toda et al.

(Continued)

*Primary Examiner* — Anh Mai
(74) *Attorney, Agent, or Firm* — Steinfl & Bruno, LLP (57) ABSTRACT

A carbon nanotube field emission device with overhanging gate fabricated by a double silicon-on-insulator process. Other embodiments are described and claimed.

15 Claims, 9 Drawing Sheets

(56) References Cited

U.S. PATENT DOCUMENTS

| | | | |
|---|---|---|---|
| 6,137,634 | A | 10/2000 | Li |
| 6,339,281 | B2 | 1/2002 | Lee et al. |
| 6,448,701 | B1 * | 9/2002 | Hsu ............................ 313/309 |
| 6,489,710 | B1 * | 12/2002 | Okita et al. ................. 313/309 |
| 6,819,041 | B2 * | 11/2004 | Kajiwara ..................... 313/496 |
| 7,064,493 | B2 | 6/2006 | Konishi |
| 7,126,266 | B2 | 10/2006 | Park et al. |
| 7,221,087 | B2 * | 5/2007 | Liu et al. .................... 313/497 |
| 7,326,328 | B2 * | 2/2008 | Hudspeth et al. ............ 205/118 |
| 7,785,904 | B2 * | 8/2010 | Natrajan et al. ............. 436/546 |
| 2004/0233530 | A1 | 11/2004 | Kramer et al. |
| 2007/0071922 | A1 | 3/2007 | Eklund et al. |
| 2008/0020499 | A1 * | 1/2008 | Kim et al. ..................... 438/20 |

OTHER PUBLICATIONS

Final Office Action mailed on Mar. 19, 2013 issued for U.S. Appl. No. 12/140,564, filed Jun. 17, 2008 in the name of Risaku Toda et al.

Non-Final Office Action. mailed on Mar. 28, 2011 issued for U.S. Appl. No. 12/140,564, filed Jun. 17, 2008 in the name of Risaku Toda et al.

Non-Final Office Action. mailed on Aug. 23, 2012 issued for U.S. Appl. No. 12/140,564, filed Jun. 17, 2008 in the name of Risaku Toda et al.

Restriction Requirement mailed on Feb. 4, 2011 issued for U.S. Appl. No. 12/140,564, filed Jun. 17, 2008 in the name of Risaku Toda et al.

* cited by examiner

METHOD FOR MANUFACTURING A CARBON NANOTUBE FIELD EMISSION DEVICE WITH OVERHANGING GATE

PRIORITY CLAIM

This application is a continuation of U.S. patent application Ser. No. 12/140,564 filed Jun. 17, 2008, which claims the benefit of U.S. Provisional Application No. 60/936,049, filed 18 Jun. 2007; and U.S. Provisional Application No. 61/008,034, filed 18 Dec. 2007.

GOVERNMENT INTEREST

The invention claimed herein was made in the performance of work under a NASA contract, and is subject to the provisions of Public Law 96-517 (35 USC 202) in which the Contractor has elected to retain title.

FIELD

The present invention relates to electronic devices and fabrication technology, and more particularly to field emission devices with carbon nanotubes.

BACKGROUND

Field emission devices (cathodes) serve as a source of electrons, and are of use in various scientific and medical fields. Such applications may include sterilization systems, gas ionization systems (e.g., mass spectrometry), klystrons, flat-panel displays, cathode ray tubes, scanning electron microscopes, transmission electron microscopes, and energy dispersive x-ray analysis, to name a few. As another example, by radiating a target with an accelerated electron beam, field emission devices may be used as a source of x-rays. In many applications, it is desirable that field emission devices provide a relatively high electron flux with relatively low power consumption, are stable with a long life, and which may be efficiently manufactured.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
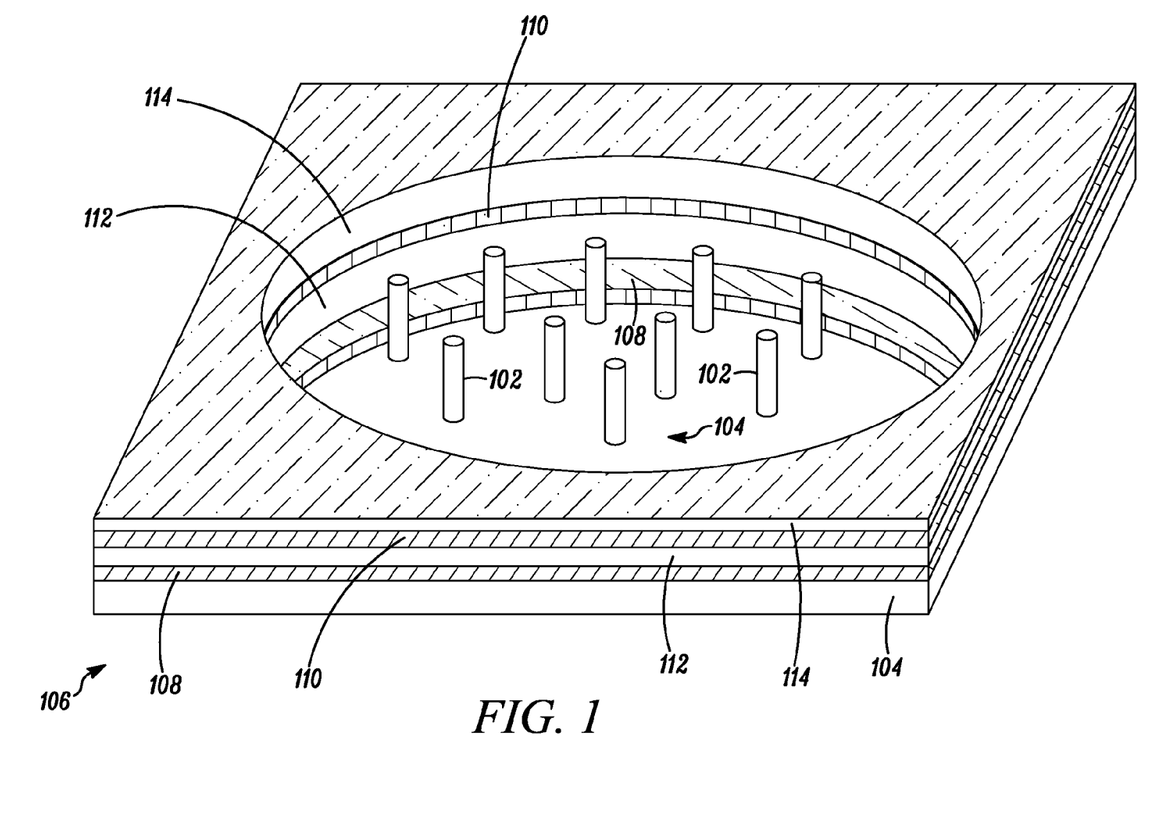
FIG. 1 illustrates a field emission device according to an embodiment.

FIG. 1 provides a simplified perspective view of a field emission device (field emitter) according to an embodiment. An array of carbon nanotubes 102 is formed on silicon substrate 104. Silicon wafer 106 also comprises two buried insulator layers, labeled 108 and 110, and two silicon device layers, labeled 112 and 114. For some embodiments, insulator layers 108 and 110 may be silicon dioxide. Other electronic devices may be integrated on silicon layers 112 and 114. Silicon layer 114 forms the gate (anode) for the carbon nanotube field emission device embodiment of FIG. 1. At the entrance (or top) to the hole in FIG. 1, a portion of layer 114 partially hangs over the bottom of the hole, thereby forming the gate. This will be made clear with respect to the other drawings.

For some embodiments, the gate diameter (the diameter of the hole at layer 114) is in the neighborhood of 25 microns, the depth of buried insulator layer 108 is in the neighborhood of 0.5 microns, the depth of buried insulator layer 110 is in the neighborhood of 1 microns, the depth of silicon device layer 112 is in the neighborhood of 9 microns, and the depth of silicon device layer 114 is in the neighborhood of 2 microns. Although not shown in FIG. 1, silicon device layer 112 may be covered with a silicon dioxide layer having a depth in the neighborhood of 0.2 microns. Carbon nanotubes labeled 102 in FIG. 1 may actually each comprise a bundle of carbon nanotubes, where for some embodiments, the diameter of a carbon nanotube bundle is in the neighborhood of 2 microns, and the typical spacing between carbon nanotube bundles is in the neighborhood of 5 microns. The separation between the gate and the nearest carbon nanotube bundles may be in the neighborhood of 1, 2, 4, or 8 microns, for example.

Although it is difficult to see from the perspective of FIG. 1 (but shown in the perspective of FIG. 2), there is an undercut so that the gate as defined by the hole at layer 114 hangs over that part of silicon layer 112. forming a sidewall of the hole. For some embodiments, this undercut may be on the order of 10 microns. This undercut will be made clearer when considering the other drawings.

These dimensions cited above are provided only as an example of an embodiment, where other embodiments may have different sized layers, gates, undercuts, and carbon nanotube intra bundle spacing and size.

Figure 2:
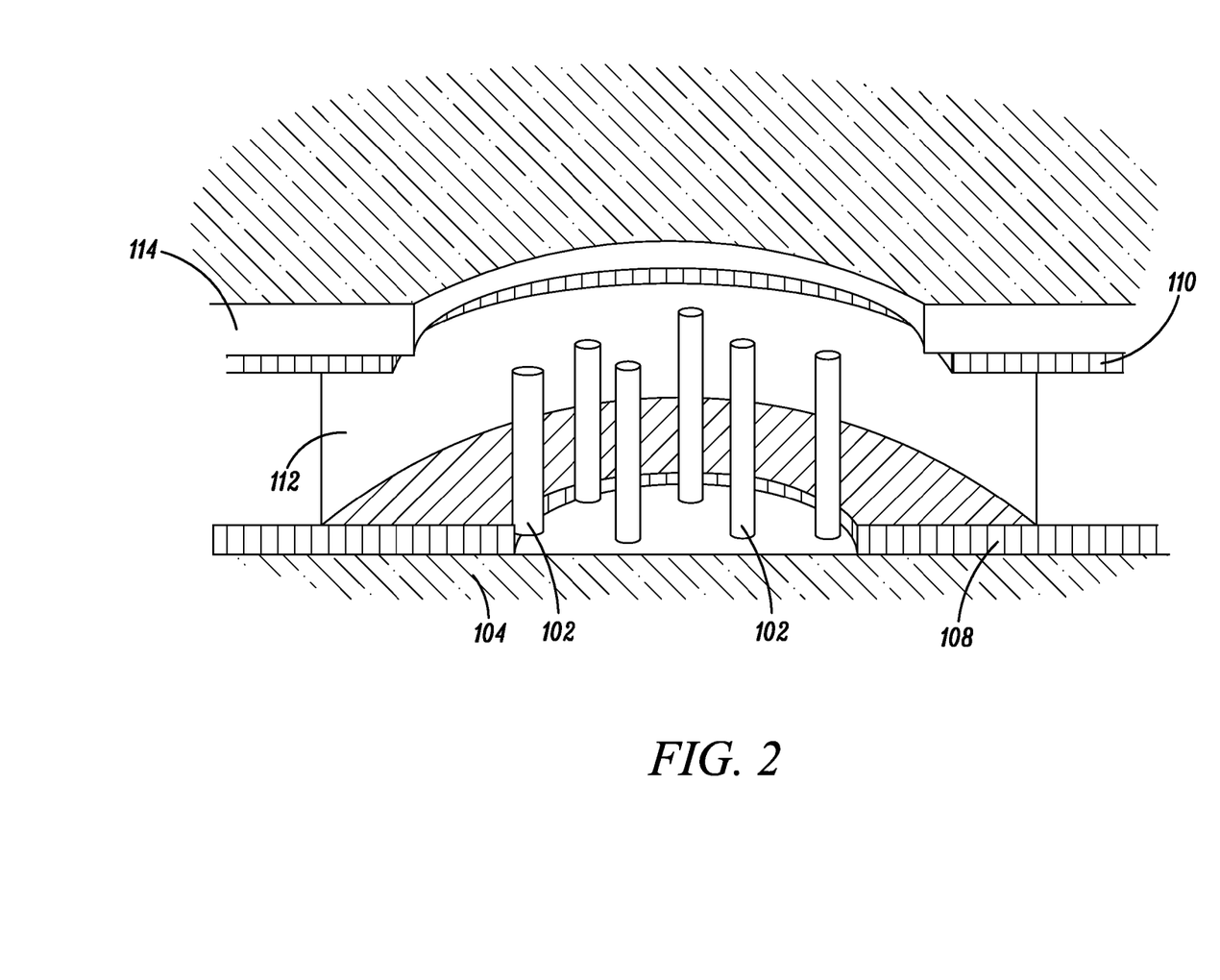
FIG. 2 illustrates a slice of the embodiment of FIG. 1.

In practice, wafer 106 is much larger than the hole illustrated in FIG. 1, but the rectangular section of wafer 106 illustrated in FIG. 1 is used to provide a perspective illustration of silicon substrate 104, buried insulator layers 108 and 110, and silicon device layers 112 and 114. Imagining that the surface of layer 114 in FIG. 1 is substantially a plane, the perspective illustrated in FIG. 1 is from a direction that forms an oblique angle to this plane, so that the hole formed in wafer 106 appears oval even though it may be circular in some embodiments. A slice through the embodiment of FIG. 1, taken perpendicular to this plane, and taken along a diameter of the hole in wafer 106, yields the perspective provided in FIG. 2. As with respect to FIG. 1, the perspective provided in FIG. 2 is simplified to illustrate an embodiment, where various components of the embodiment are not illustrated to scale. The perspective in FIG. 2 shows silicon substrate layer 104, buried insulator layer 108, silicon device layer 112, buried insulator layer 110, and silicon device layer 114. Also shown are carbon nanotubes 102. The array of carbon nanotubes may not necessarily be a regularly-spaced array. In practice, carbon nanotubes 102 may vary in height within a particular embodiment, and well in general not be linear cylinders as shown in the simplified illustration of FIGS. 1 and 2.

Figure 3:
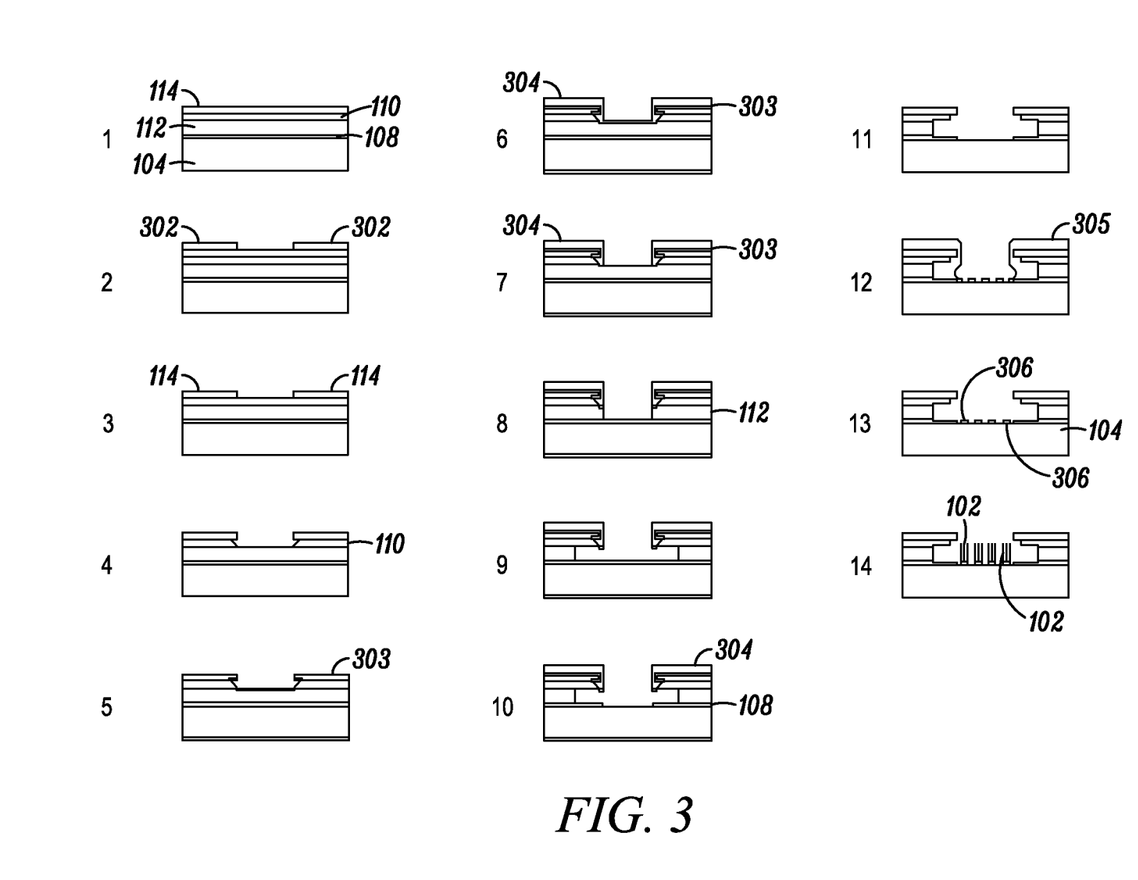
FIG. 3 illustrates a process to fabricate a field emission device according to the embodiment of FIG. 1.

FIG. 3 illustrates a process to fabricate a carbon nanotube field emission device according to an embodiment, where various steps in the process are numerically labeled from 1 through 14. Each process is represented by a simplified plan view of a slice through wafer 106, where the slice is perpendicular to the plane defined by silicon device layer 114 of FIG. 1. Step 1 in FIG. 3 is not actually a process step, but illustrates wafer 106 before the process steps illustrated in FIG. 3 are performed. As a point of reference, silicon substrate layer 104, buried insulator layers 108 and 110, and silicon device layers 108 and 114 are labeled in step 1, but for ease of illustration these numeric labels are only sometimes repeated in the other process steps illustrated in FIG. 3.

In step 2, photoresist layer 302 has been formed and patterned on silicon device layer 114 by well-known lithographic techniques. Silicon layer 114 is etched by deep reactive ion etching (DRIE), and photoresist layer 302 is removed, resulting in step 3. In step 4, buried insulator layer 110 has been etched by a hydrofluoric (IV) acid solution. The wafer is then thermally oxidized to passivate all exposed silicon surfaces with silicon dioxide layer 303, including the exposed sidewalls, as indicated in step 5.

As illustrated in step 6, photoresist layer 304 has been applied and patterned by well-known lithographic techniques, and a hole is opened into thermal silicon dioxide layer 303 by reactive ion etching (RIE) as shown in step 7. Silicon device layer 112 is then etched by DRIE as illustrated in step 8. The wafer is then etched with xenon difluoride ($XeF_2$), as illustrated in step 9. $XeF_2$ reacts only with exposed silicon and does not damage other materials such as photoresist and $SiO_2$. As shown in step 9, the silicon etch front propagates laterally. A portion of buried insulator layer 108 is removed by RIE as shown in step 10. As shown in step 11, photo resist layer 304 is removed and the thermal silicon dioxide layer grown in step 5 is removed by HF.

As indicated in step 12, photo resist layer 305 is applied, and patterned at the bottom of the hole on silicon substrate 104 as shown. This pattern allows a catalyst dot array pattern 306 to be applied to the bottom of the hole on silicon substrate 104 as shown in step 13, where photoresist layer 305 has been removed. For some embodiments, the catalyst may be iron (Fe), with a thickness of 25 Angstroms. Under the Fe, there is a 30 Angstrom thick Aluminum oxide layer that serves as a diffusion barrier. Both Fe and Si inter-diffuse at the elevated temperature used for carbon nanotube growth. Carbon nanotubes 102 are then grown on the catalyst dot array 306 as shown in step 14.

Figure 4:
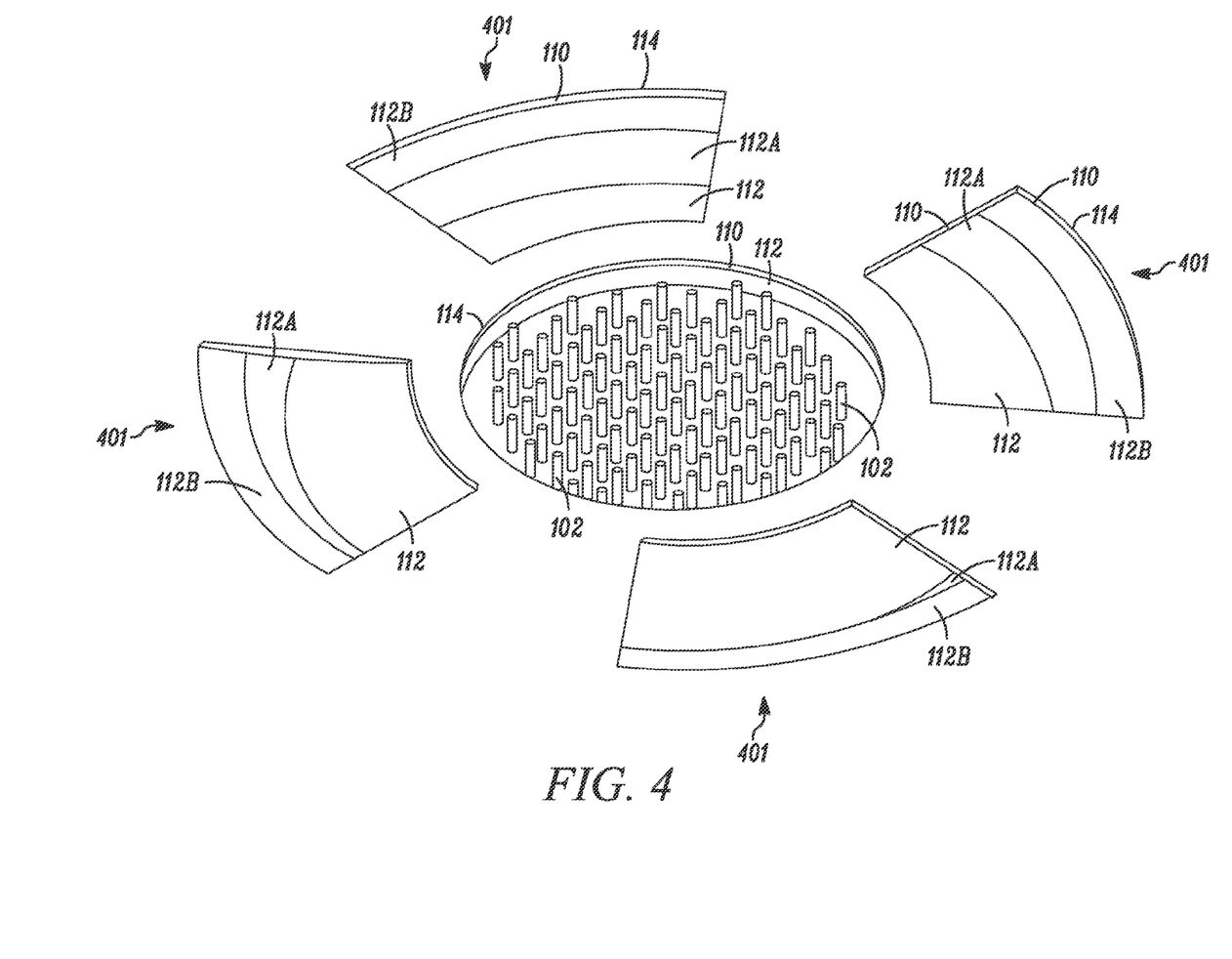
FIG. 4 illustrates a field emission device according to another embodiment.

Some embodiments may use drain holes formed near the gate electrodes (the portion of silicon device layer 114 that overhangs sidewall silicon device layer 112 at the top of the etched hole) to allow excess photoresist at the bottom of the hole to be spun out by centrifugal force. An embodiment is illustrated in FIG. 4. For ease of illustration, not all layers in wafer 106 are shown in FIG. 4. Four drain holes are illustrated in FIG. 4, pointed to by arrows labeled 401. The perspective of FIG. 4 is oblique to the plane defined by silicon device 114 (see FIG. 1), but the planes so defined are shown in FIG. 4 as slightly tilted to reveal some of the structure. Holes 401 show three steps leading from silicon device layer 112 to the top of silicon device layer 114. Two of the steps are labeled 112A and 112B, which may comprise silicon device layer 112. In some of the holes, it is difficult to show buried insulator layer 110 and top silicon device layer 114.

Figure 5:
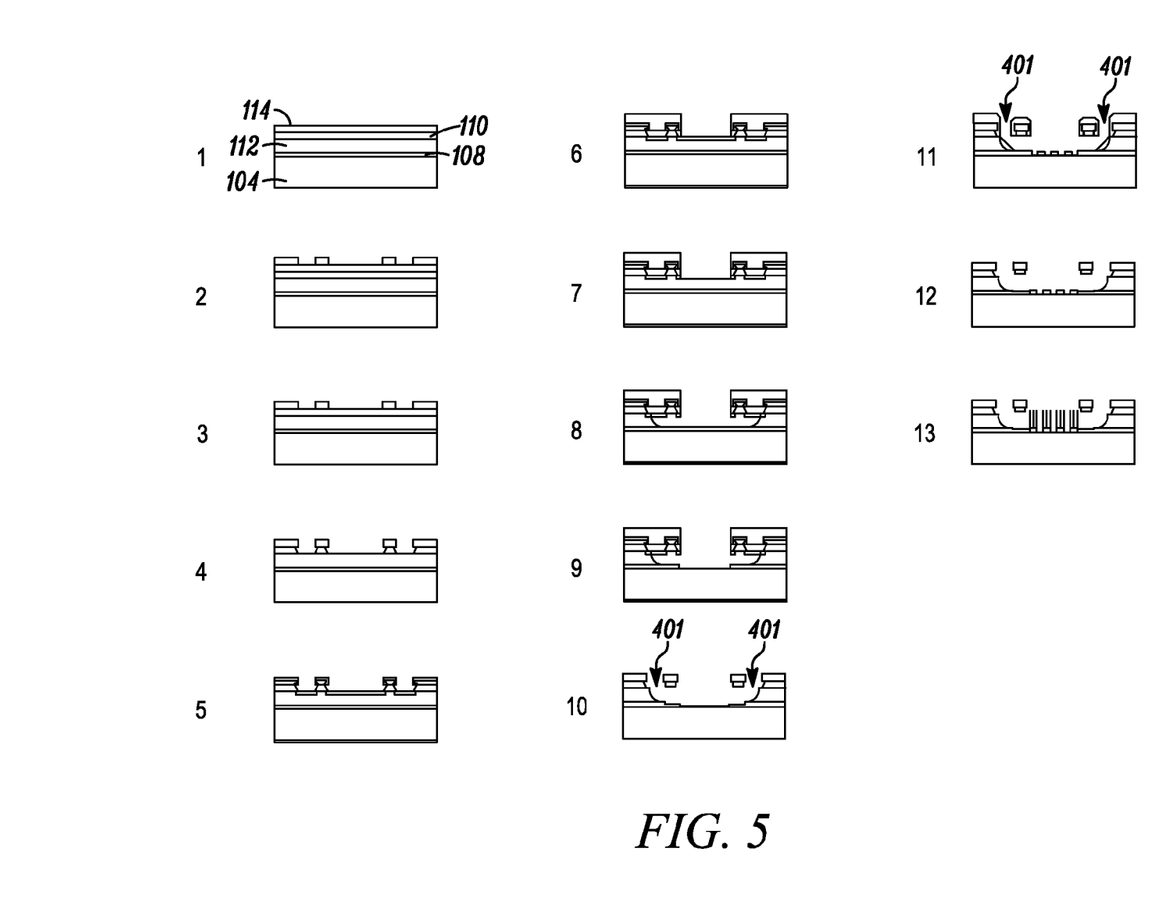
FIG. 5 illustrates a process to fabricate a field emission device according to the embodiment of FIG. 4.

FIG. 5 illustrates a sequence of processing steps for an embodiment which includes holes 401. The slice taken to provide the plan view of FIG. 5 is such that it cuts the hole along its diameter, and also includes two holes 401. The process steps illustrated in FIG. 5 are very similar to that of FIG. 3, and not all of the details need be repeated. However, step 7 in FIG. 5 includes an $XeF_2$ isotropic Si etch, and holes 401 are eventually formed as indicated in step 10 of FIG. 5. In step 11 of FIG. 5, the wafer is spun so that excess photoresist may be spun out through holes 401.

Figure 6:
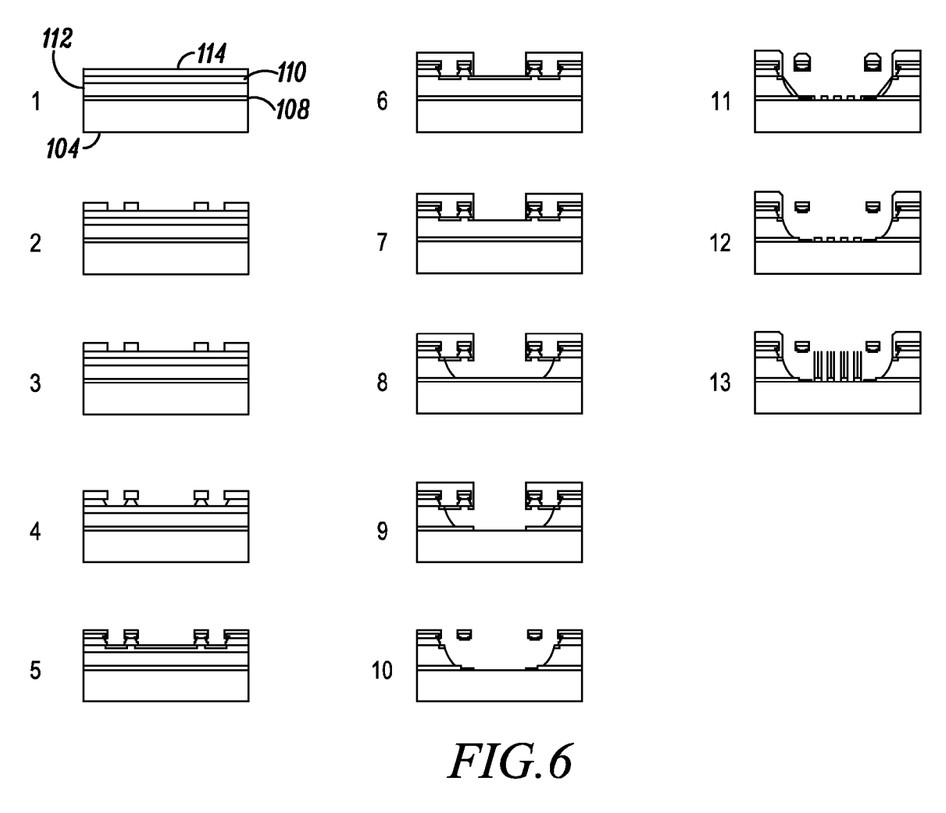
FIG. 6 illustrates a process to fabricate a field emission device according to another embodiment.

FIG. 6 represents a process according to another embodiment, with steps very similar to that of FIG. 5, except that in step 10 of FIG. 6 the thermally grown silicon dioxide layer in step 5 is left on the gate electrode. This may help mitigate accidental shorting between the carbon nanotubes and the gate electrode if the carbon nanotubes were to droop.

Figure 7:
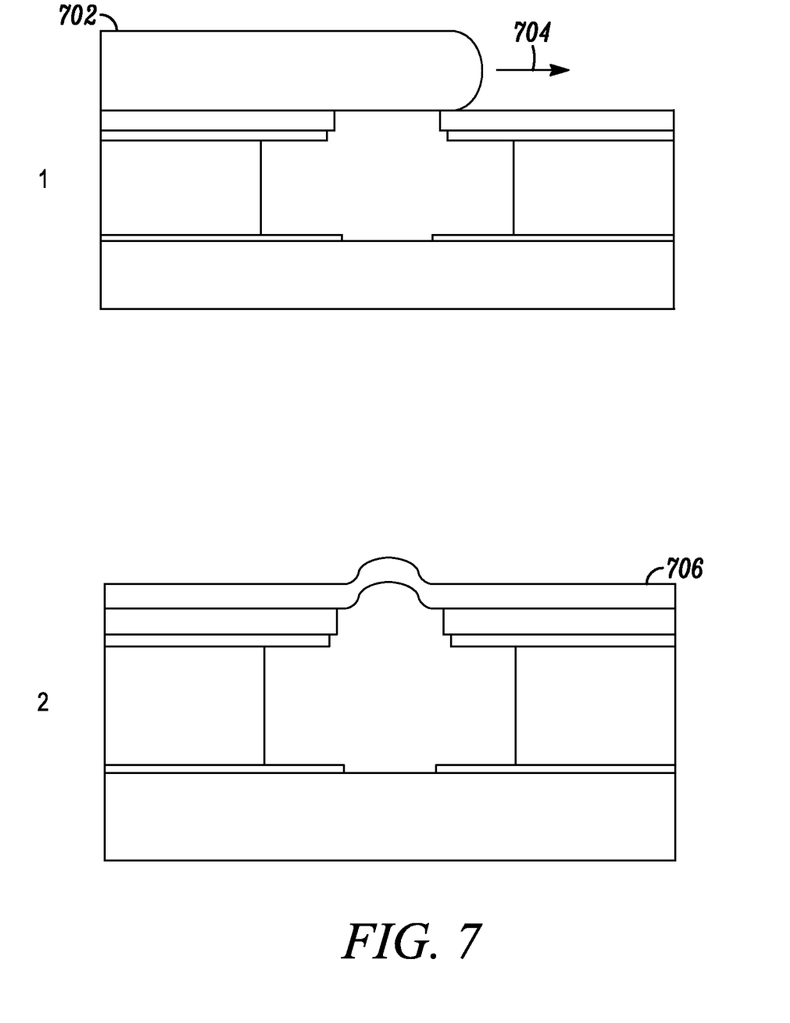
FIG. 7 illustrates a process to fabricate a field emission device according to another embodiment.

When photoresist material is applied to the bottom of the hole, as in step 12 of FIG. 3, it may be confined due to the overhanging gate. During spin-coating, the centrifugal force may not be sufficient to cause excess photoresist material to flow out from the hole because some of the photoresist may be trapped under the gate overhang. This may result in the photoresist in the hole becoming too thick for lithographical pattern transfer. However, FIG. 7 illustrates a process to manufacture a field emission carbon nanotube device in which step 12. in FIG. 3 has been modified. In step 1 of FIG. 7, photoresist material 702 of relatively high viscosity is applied to the wafer, where arrow 704 pictorially represents this high viscosity photoresist material flowing across the hole opening so as to form a bridge across the opening. In step 2 of FIG. 7, the wafer is spun so that the high viscosity photoresist material forms into a membrane of relatively uniform thickness. Photoresist membrane 706 is then patterned to provide openings so that catalyst material may be applied through these openings to fall to the bottom of the hole and form an array of catalyst dots. In this way, the embodiment of FIG. 7 avoids problems associated with applying photoresist material to the bottom of the hole. (During the following soft-bake of the photoresist, the trapped air undergoes a volumetric expansion due to the applied heat, and the photoresist membrane solidifies with a slight upward bulge of roughly 5 to 10 microns in size.)

A particular photoresist material that may be used is known as AZ4330RS, a product of Clariant Corporation, AZ Electronic Materials, with U.S. headquarters in Somerville, N.J.

Figure 8:
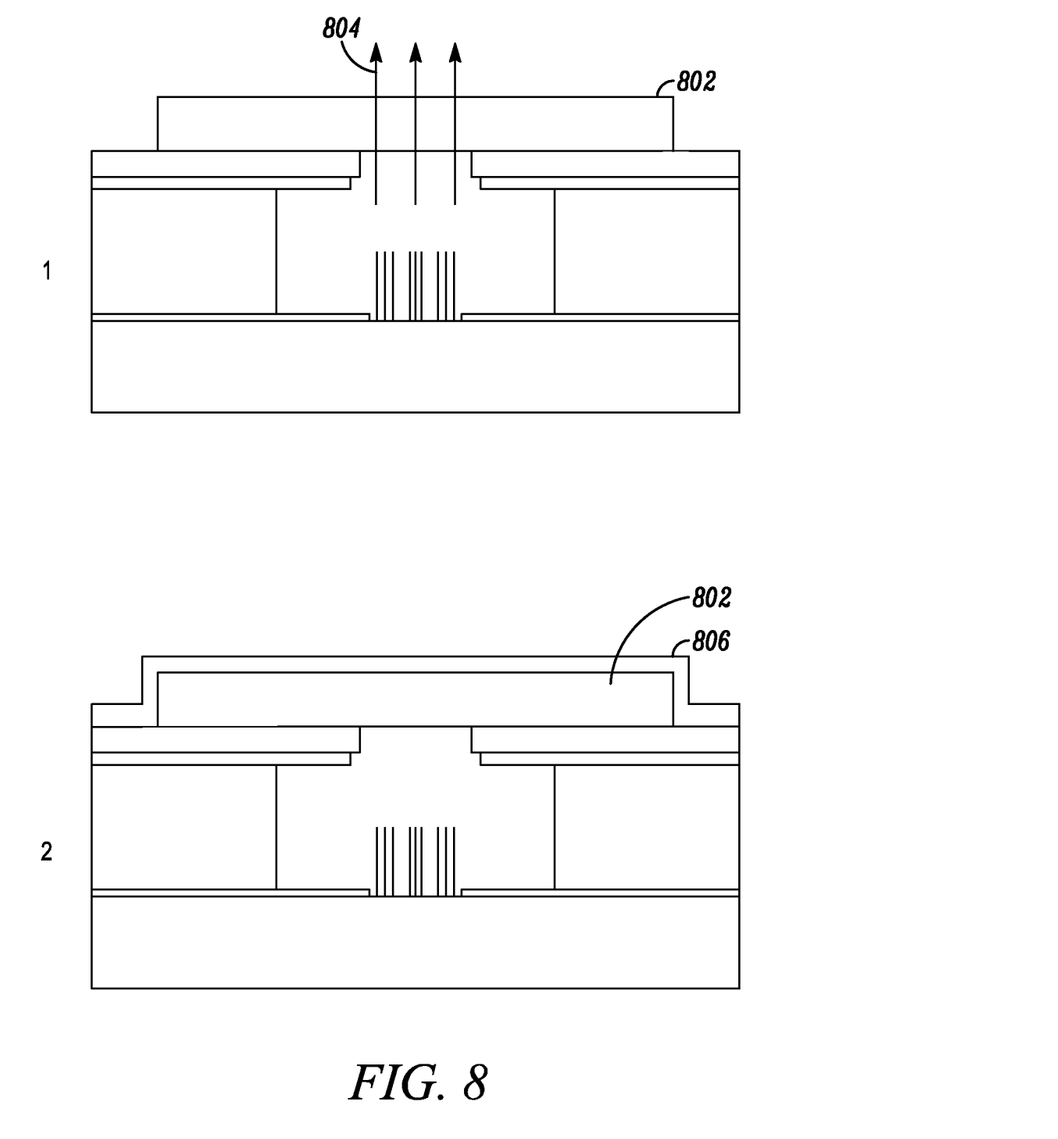
FIG. 8 illustrates a process to fabricate a field emission device according to another embodiment.

FIG. 8 illustrates an embodiment in which, after the field emission carbon nanotube device has been fabricated according to a previously described embodiment, sol-gel material is applied to bridge across the hole opening and the wafer is spin-coated. In step 1 of FIG. 8, sol-gel material 802 is dried and cured to form a solid and gas permeable membrane. Arrows 804 pictorially illustrate gas that is pumped out through gas permeable membrane 802. Hermetic layer 806 is deposited by chemical vapor deposition (CVD) or physical vapor deposition (PVD) to hermetically seal the device. The cavity is thereby hermetically sealed under a relatively high vacuum, so that the resulting device may have applications in vacuum electronic devices. An array of such cavities may be fabricated on a wafer substrate to provide a complex circuit of vacuum electronic components, where for some embodiments neighboring cavities may be connected together by subsurface tunnels made by lateral recess etching.

Figure 9:
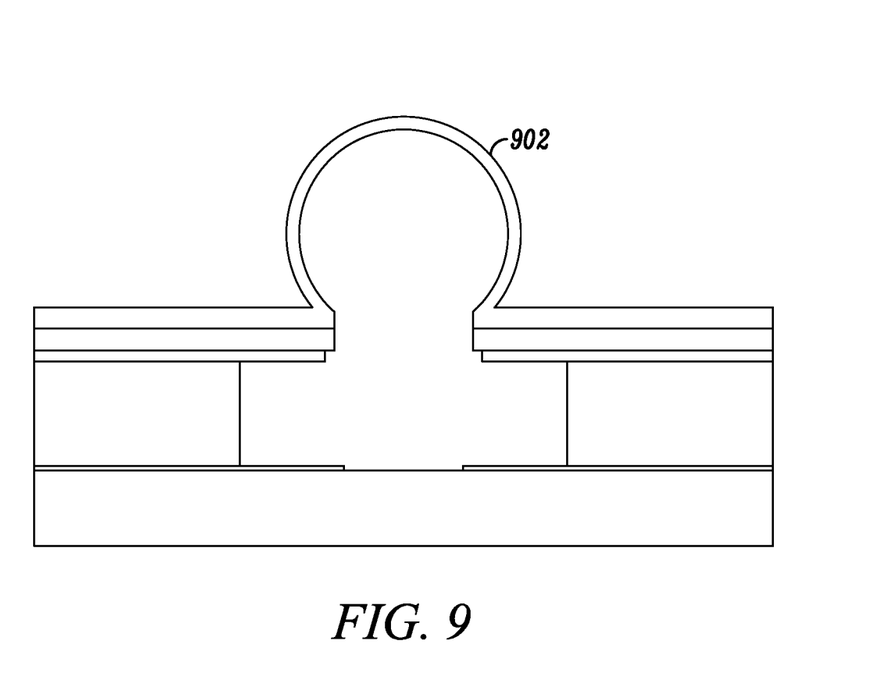
FIG. 9 illustrates a glass-blowing process according to an embodiment.

FIG. 9 illustrates an embodiment, which may be described as having a micro glass-blowing package. Coated membrane 902 is applied as described with respect to the embodiment of FIG. 8, and is formed into the shape as illustrated in FIG. 9 by a pressure difference between the cavity and the outside environment. For example, a glasslike material may be prepared as a sol-gel, and deformed by the expansion of trapped air in the cavity. The membrane material is not necessarily limited to sol-gel materials, but may also include other materials like the epoxy, which will harden after pressure deformation. Potential applications may include gas confinement chambers and microscopic glass lenses, to name just a couple.

Various modifications may be made to the described embodiments without departing from the scope of the invention as claimed below.

What is claimed is:

1. A semiconductor process applied to a wafer, the wafer comprising a silicon substrate; a first insulator layer on the silicon substrate; a first silicon layer on the first insulator layer; a second insulator layer on the first silicon layer; and a second silicon layer on the second insulator layer; the semiconductor process comprising:
    etching through the second silicon layer, through the second insulator layer, and through the first silicon layer to the first insulator layer to define a hole;
    lateral etching in the first silicon layer to laterally enlarge the hole at the first silicon layer;
    etching through the first insulator layer to the substrate, so that the hole has a bottom that includes the substrate;
    depositing a removable material on the wafer; and
    forming an array of carbon nanotubes at the bottom of the hole on the substrate.

2. The semiconductor process as set forth in claim 1, where the depositing the removable material on the wafer comprises depositing the removable material on the substrate at the bottom of the hole.

3. The semiconductor process as set forth in claim 2, where forming the array of carbon nanotubes at the bottom of the hole on the substrate further comprises:
    patterning the removable material to provide a pattern for a catalyst; depositing the catalyst on the substrate at the bottom of the hole; and growing the array of carbon nanotubes on the catalyst.

4. The semiconductor process as set forth in claim 3 further comprising removing the removable material from the wafer after depositing the catalyst on the substrate at the bottom of the hole and before growing the array of carbon nanotubes on the catalyst.

5. The semiconductor process as set forth in claim 1, where depositing the removable material comprises depositing the removable material on the wafer so that the removable material bridges the opening of the hole.

6. The semiconductor process as set forth in claim 5, where forming the array of carbon nanotubes at the bottom of the hole on the substrate further comprises: patterning the removable material to provide a pattern for a catalyst; depositing the catalyst on the substrate at the bottom of the hole; and growing the array of carbon nanotubes on the catalyst.

7. The semiconductor process as set forth in claim 6, where patterning the removable material to provide a pattern for a catalyst comprises forming a plurality of openings through which the catalyst for carbon nanotube formation is adapted to be deposited onto the bottom of the hole on the substrate.

8. The semiconductor process as set forth in claim 6, where the catalyst is comprised within a catalyst dot array.

9. The semiconductor process as set forth in claim 1, where the removable material is a photoresist material.

10. The semiconductor process as set forth in claim 1, further comprising depositing a second material on the wafer after removing the removable material from the wafer.

11. The semiconductor process as set forth in claim 10, where the second material comprises sol-gel material or micro glass-blowing material.

12. The semiconductor process as set forth in claim 11, where the micro glass-blowing material is a sol-gel or epoxy material.

13. The semiconductor process as set forth in claim 1, where the first and second insulator layers comprise silicon dioxide.

14. The semiconductor process as set forth in claim 1, where the second silicon layer forms a gate with respect to at least one carbon nanotubes in the array of carbon nanotubes at the bottom of the hole on the substrate.

15. The semiconductor process as set forth in claim 1, where the hole has a top and a sidewall, the second silicon layer forming at least a portion of the sidewall wherein the second silicon layer at the top of the hole overhangs the sidewall.

* * * * *